US010971700B2

(12) United States Patent
Im et al.

(10) Patent No.: US 10,971,700 B2
(45) Date of Patent: Apr. 6, 2021

(54) ORGANIC LIGHT EMITTING DIODE DISPLAY

(71) Applicant: LG DISPLAY CO., LTD., Seoul (KR)

(72) Inventors: Jonghyeok Im, Paju-si (KR); Jaesung Lee, Paju-si (KR); Dohyung Kim, Paju-si (KR); Seungwon Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/224,382

(22) Filed: Dec. 18, 2018

(65) Prior Publication Data
US 2019/0198806 A1    Jun. 27, 2019

(30) Foreign Application Priority Data
Dec. 27, 2017 (KR) .................. 10-2017-0181317

(51) Int. Cl.
*H01L 27/32* (2006.01)
*H01L 51/52* (2006.01)
*G09G 3/3233* (2016.01)
*G09G 3/3208* (2016.01)

(52) U.S. Cl.
CPC ........ *H01L 51/5253* (2013.01); *H01L 27/322* (2013.01); *H01L 27/3223* (2013.01); *H01L 27/3246* (2013.01); *H01L 27/3262* (2013.01); *H01L 27/3279* (2013.01); *H01L 51/5228* (2013.01); *H01L 51/5284* (2013.01); *G09G 3/3208* (2013.01); *G09G 3/3233* (2013.01); *H01L 51/5246* (2013.01)

(58) Field of Classification Search
CPC ............. H01L 51/5228; H01L 27/3279; H01L 27/3223
See application file for complete search history.

(56) References Cited

U.S. PATENT DOCUMENTS

2011/0248262 A1* 10/2011 Kang ................... G02F 1/1333
257/43
2014/0183501 A1* 7/2014 Kim .................... H01L 27/3246
257/40
(Continued)

FOREIGN PATENT DOCUMENTS

CN    103137891 A    6/2013
JP    2010-27500 A    2/2010
(Continued)

*Primary Examiner* — Grant S Withers
(74) *Attorney, Agent, or Firm* — Birch, Stewart, Kolasch & Birch, LLP

(57) ABSTRACT

An organic light emitting diode display is discussed. The organic light emitting diode display can include a substrate including a thin film transistor region in which a thin film transistor and an organic light emitting diode connected to the thin film transistor are disposed, and an auxiliary electrode region in which an auxiliary electrode is disposed, a barrier disposed on the auxiliary electrode, a cathode included in the organic light emitting diode, divided by the barrier, and exposing at least a portion of the auxiliary electrode, an end of the cathode being in direct contact with the auxiliary electrode, and a cover layer disposed on the cathode, the cover layer having continuity to cover the barrier and the auxiliary electrode.

17 Claims, 11 Drawing Sheets

(56) References Cited

U.S. PATENT DOCUMENTS

| | | | |
|---|---|---|---|
| 2015/0243723 A1* | 8/2015 | Cho | H01L 27/124 |
| | | | 257/43 |
| 2017/0033166 A1 | 2/2017 | Shim et al. | |
| 2017/0125506 A1 | 5/2017 | Kim | |
| 2017/0185181 A1* | 6/2017 | Kim | G02F 1/1345 |
| 2019/0088730 A1* | 3/2019 | Lee | H01L 27/3253 |
| 2019/0131365 A1* | 5/2019 | Jung | H01L 51/5246 |
| 2019/0140037 A1* | 5/2019 | Lee | H01L 27/3283 |
| 2019/0140038 A1* | 5/2019 | Lee | H01L 27/3262 |
| 2019/0140039 A1* | 5/2019 | Lee | H01L 51/5246 |
| 2019/0165063 A1* | 5/2019 | Lee | H01L 27/3276 |
| 2019/0165064 A1* | 5/2019 | Lee | H01L 51/5228 |
| 2020/0243627 A1* | 7/2020 | Lee | H01L 27/3246 |

FOREIGN PATENT DOCUMENTS

| | | |
|---|---|---|
| JP | 2010-198969 A | 9/2010 |
| JP | 2012-182120 A | 9/2012 |
| KR | 10-2016-0002537 A | 1/2016 |
| WO | WO 2017/094760 A | 6/2017 |

\* cited by examiner

ORGANIC LIGHT EMITTING DIODE DISPLAY

CROSS-REFERENCE TO RELATED APPLICATION

This application claims the priority benefit of Korean Patent Application No. 10-2017-0181317 filed on Dec. 27, 2017 in the Republic of Korea, which is incorporated herein by reference for all purposes as if fully set forth herein.

BACKGROUND OF THE INVENTION

Field of the Invention

The present disclosure relates to an organic light emitting diode display.

Discussion of the Related Art

Various display devices have replaced heavier and larger cathode ray tubes (CRTs). Examples of such display devices can include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

The OLED display includes organic light emitting diodes (OLEDs) converting electric energy into light energy. The OLED includes an anode, a cathode, and an organic compound layer between the anode and the cathode. The OLED display is configured such that the OLED emits light while excitons formed by combining holes from the anode and electrons from the cathode inside an emission layer fall from an excited state to a ground state, and thus displays an image.

However, a large-area OLED display cannot maintain a uniform luminance throughout the entire surface of an active area, on which an input image is displayed, and generates a luminance variation (or luminance deviation) depending on a position. More specifically, a cathode constituting an organic light emitting diode is formed to cover most of the active area, and there is a problem in that a power voltage applied to the cathode may not have a constant voltage value throughout the entire surface of the active area. For example, as a difference between a voltage value at an entrance of the cathode supplied with the power voltage and a voltage value at a position apart from the entrance increases due to a resistance of the cathode, the luminance variation depending on the position can increase.

This issue can be more problematic in a top emission type display device. Namely, in the top emission type display device, because it is necessary to secure a transmittance of a cathode positioned at an upper layer of an organic light emitting diode, the cathode is formed of a transparent conductive material such as indium tin oxide (ITO), or an opaque conductive material with a very small thickness. In this instance, because a surface resistance of the cathode increases, a luminance variation depending on a position can remarkably increase corresponding to an increase in the surface resistance.

SUMMARY OF THE INVENTION

The present disclosure provides an organic light emitting diode display capable of achieving a uniform luminance by minimizing a variation in a low potential power voltage depending on a position.

The present disclosure also provides an organic light emitting diode display and its method, which address limitations and disadvantages associated with the related art.

In one aspect of the present disclosure, there is provided an organic light emitting diode display comprising a substrate including a thin film transistor region in which a thin film transistor and an organic light emitting diode connected to the thin film transistor are disposed, and an auxiliary electrode region in which an auxiliary electrode is disposed, a barrier disposed on the auxiliary electrode, a cathode included in the organic light emitting diode, divided by the barrier, and exposing at least a portion of the auxiliary electrode, an end of the cathode being in direct contact with the auxiliary electrode, and a cover layer disposed on the cathode, the cover layer having continuity to cover the barrier and the auxiliary electrode.

The organic light emitting diode display can further comprise a protective layer interposed between the cathode and the cover layer. The protective layer can be divided by the barrier and can expose at least a portion of the auxiliary electrode.

The organic light emitting diode display can further comprise a power line disposed under the auxiliary electrode with at least one insulating layer interposed therebetween and receiving a power voltage from a power generating part. The auxiliary electrode can be electrically connected to the power line through a contact hole penetrating the insulating layer.

An organic compound layer of the organic light emitting diode can be divided by the barrier and exposes at least a portion of the auxiliary electrode. The end of the cathode on the organic compound layer can be extended more than an end of the organic compound layer and can directly contact the auxiliary electrode.

The cover layer can include any one selected among aluminum oxide (Al2O3) and silicon nitride (SiNx).

A thickness of the cover layer can be less than a thickness of the protective layer.

The cover layer can cover an open area generated as the protective layer is divided by the barrier.

In another aspect of the present disclosure, there is provided an organic light emitting diode display comprising a substrate including a thin film transistor region in which a thin film transistor and an organic light emitting diode connected to the thin film transistor are disposed, and an auxiliary electrode region in which an auxiliary electrode is disposed, a passivation layer disposed on the auxiliary electrode and exposing at least a portion of the auxiliary electrode, a dummy pattern disposed on the passivation layer, the dummy pattern including a protrusion protruding more than the passivation layer in an area overlapping with the auxiliary electrode, a cathode included in the organic light emitting diode, divided by the protrusion, and exposing at least a portion of the auxiliary electrode, an end of the cathode being in direct contact with the auxiliary electrode, and a cover layer disposed on the cathode, the cover layer having continuity to cover the protrusion and the auxiliary electrode.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure. In describing various embodiments, the same components may be described in a first embodiment, and a description thereof may be omitted in other embodiments.

The terms "first", "second", etc. may be used to describe various components, but the components are not limited by such terms. The terms are used only for the purpose of distinguishing one component from other components.

Figure 1:
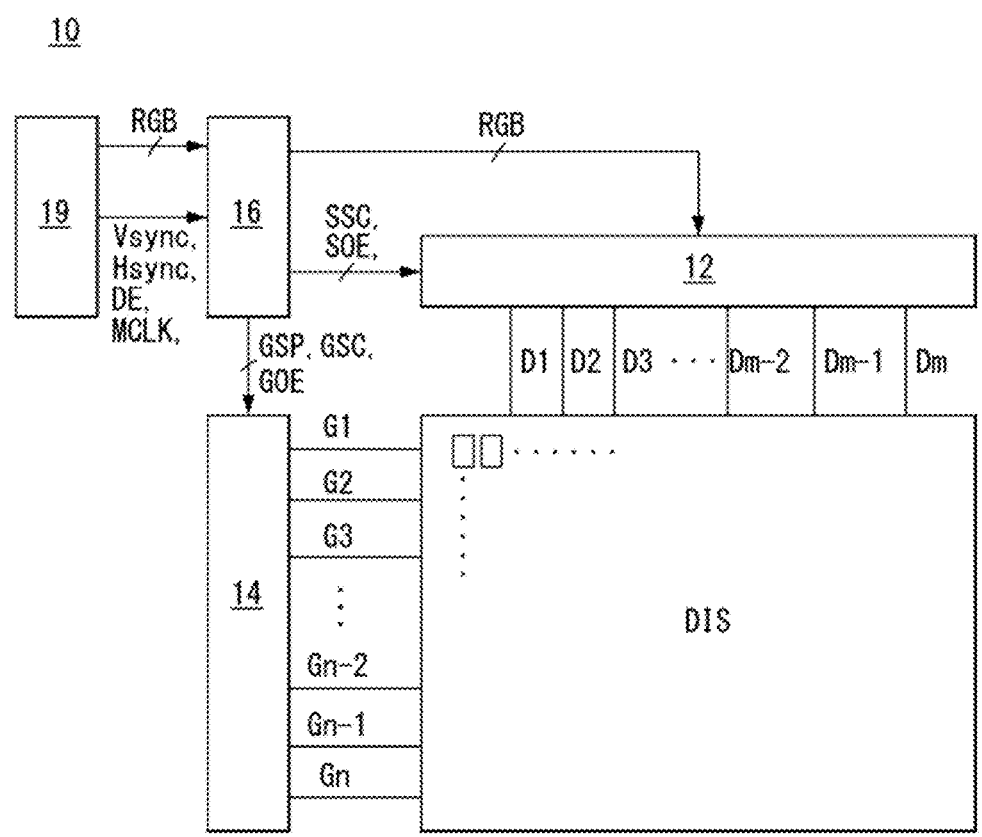
FIG. 1 is a block diagram schematically illustrating an organic light emitting diode (OLED) display according to an embodiment of the disclosure.
Figure 2:
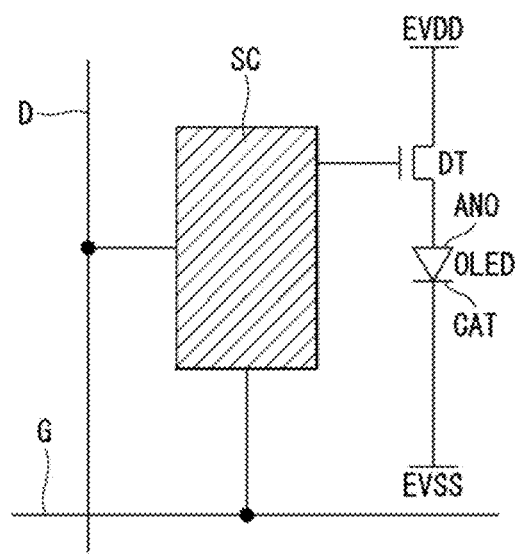
FIG. 2 schematically illustrates configuration of a pixel shown in FIG. 1.

FIG. 1 is a block diagram schematically illustrating an organic light emitting diode (OLED) display according to an embodiment of the disclosure. FIG. 2 schematically illustrates configuration of a pixel shown in FIG. 1. All the components of the OLED displays according to all embodiments of the disclosure are operatively coupled and configured.

Referring to FIG. 1, an OLED display 10 according to the embodiment of the disclosure includes a display driving circuit and a display panel DIS.

The display driving circuit includes a data driving circuit 12, a gate driving circuit 14, and a timing controller 16. The display driving circuit applies a video data voltage of an input image to pixels of the display panel DIS. The data driving circuit 12 converts digital video data RGB received from the timing controller 16 into an analog gamma compensation voltage and generates a data voltage. The data voltage output from the data driving circuit 12 is supplied to data lines D1 to Dm, where m is a positive integer. The gate driving circuit 14 sequentially supplies a gate signal synchronized with the data voltage to gate lines G1 to Gn and selects pixels of the display panel DIS to which the data voltage is applied, where n is a positive integer.

The timing controller 16 receives timing signals, such as a vertical sync signal Vsync, a horizontal sync signal Hsync, a data enable signal DE, and a main clock MCLK, from a host system 19 and synchronizes operation timing of the data driving circuit 12 with operation timing of the gate driving circuit 14. A data timing control signal for controlling the data driving circuit 12 includes a source sampling clock SSC, a source output enable signal SOE, and the like. A gate timing control signal for controlling the gate driving circuit 14 includes a gate start pulse GSP, a gate shift clock GSC, a gate output enable signal GOE, and the like.

The host system 19 can be one of a television system, a set-top box, a navigation system, a DVD player, a Blu-ray player, a personal computer (PC), a home theater system, a phone system (e.g., a smart phone), a smart watch, and any other systems that include or operate in conjunction with a display. The host system 19 includes a system-on chip (SoC), in which a scaler is embedded, and converts the digital video data RGB of the input image into a format suitable for displaying the input image on the display panel DIS. The host system 19 transmits the digital video data RGB of the input image and the timing signals Vsync, Hsync, DE and MCLK to the timing controller 16.

The display panel DIS includes a pixel array. The pixel array includes the pixels defined by the data lines D1 to Dm and the gate lines G1 to Gn. Each pixel includes an organic light emitting diode serving as a self-emission element.

Referring to FIG. 2, the display panel DIS includes a plurality of data lines D, a plurality of gate lines G intersecting the data lines D, and pixels respectively arranged at intersections of the data lines D and the gate lines G in a matrix. Each pixel includes an organic light emitting diode, a driving thin film transistor (TFT) DT for controlling an amount of current flowing through the organic light emitting diode, and a programming unit SC for setting a gate-to-source voltage of the driving thin film transistor DT.

The programming unit SC can include at least one switching thin film transistor and at least one storage capacitor. The switching thin film transistor is turned on in response to a gate signal from the gate line G to thereby apply a data voltage from the data line D to one electrode of the storage capacitor. The driving thin film transistor DT controls an amount of current supplied to the organic light emitting diode depending on a magnitude of voltage stored in the storage capacitor, thereby controlling an amount of light emitted by the organic light emitting diode. The amount of light emitted by the organic light emitting diode is proportional to the amount of current supplied from the driving thin film transistor DT. The pixel is connected to a high potential power voltage source and a low potential power voltage source and receives a high potential power voltage EVDD and a low potential power voltage EVSS from a power generating part. The thin film transistors constituting the pixel can be p-type thin film transistors or n-type thin film transistors. Further, semiconductor layers of the thin film transistors constituting the pixel can include amorphous silicon, polycrystalline silicon, or oxide. In the following description, embodiments of the disclosure use a semiconductor layer including oxide as an example. The organic light emitting diode includes an anode ANO, a cathode CAT, and an organic compound layer between the anode ANO and the cathode CAT. The anode ANO is connected to the driving thin film transistor DT.

First Embodiment

Figure 3:
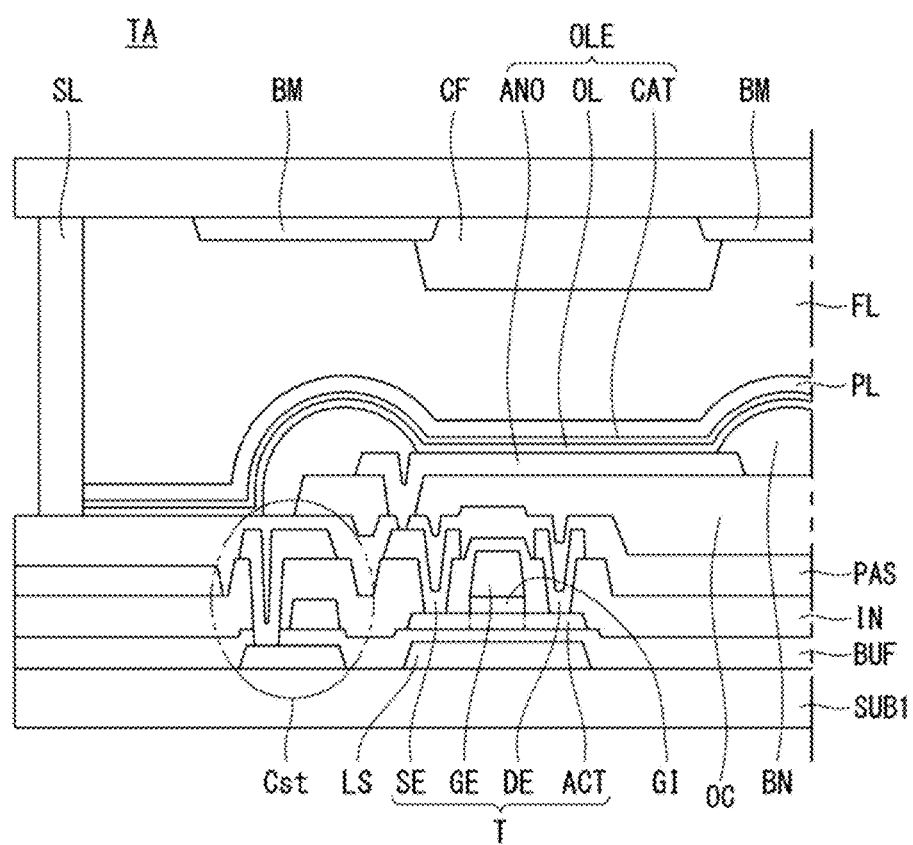
FIG. 3 is a cross-sectional view schematically illustrating a thin film transistor region of an OLED display according to a first embodiment of the disclosure.
Figure 4:
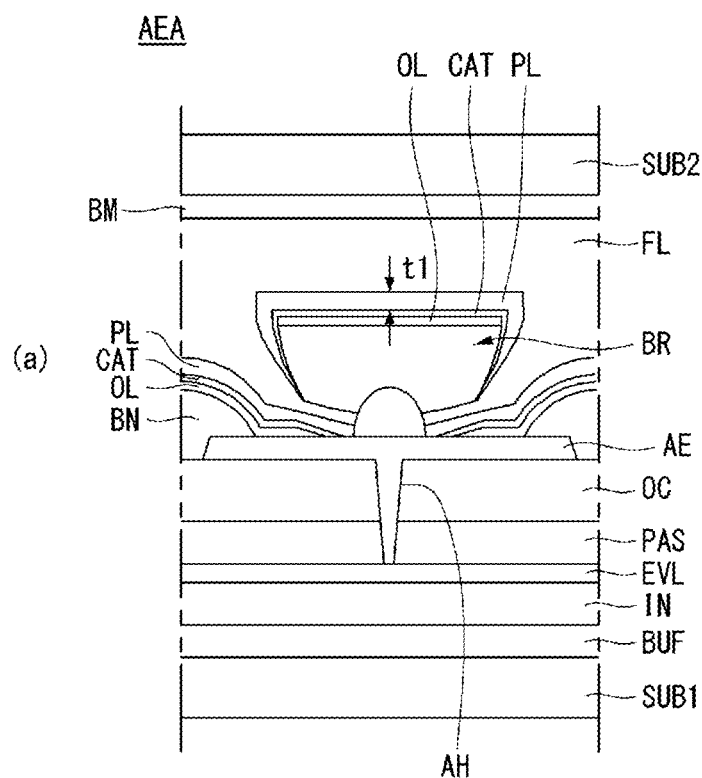
FIG. 4 is a cross-sectional view schematically illustrating an auxiliary electrode region of the OLED display according to the first embodiment of the disclosure.
Figure 4:
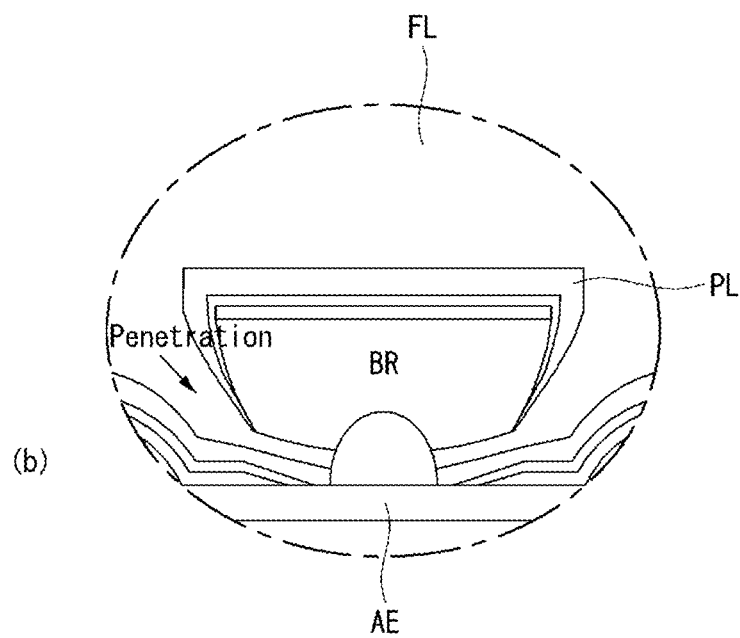

FIG. 3 is a cross-sectional view schematically illustrating a thin film transistor region of an OLED display according to a first embodiment of the disclosure. FIG. 4 is a cross-sectional view schematically illustrating an auxiliary electrode region of the OLED display according to the first embodiment of the disclosure. Particularly, (b) of FIG. 4 shows an enlarged area in (a) of FIG. 4.

Referring to FIGS. 3 and 4, the OLED display according to the first embodiment of the disclosure includes a display panel including a first substrate SUB1 and a second substrate SUB2 facing each other. A filler layer FL can be interposed between the first substrate SUB1 and the second substrate SUB2.

The first substrate SUB1 is a thin film transistor array substrate on which a thin film transistor T and an organic light emitting diode OLE are disposed. The second substrate SUB2 is a color filter array substrate on which a color filter CF is disposed. The second substrate SUB2 can function as an encapsulation substrate. The first substrate SUB1 and the second substrate SUB2 can be attached to each other using a sealant SL. The sealant SL is disposed at an edge of the first substrate SUB1 and an edge of the second substrate SUB2 and maintains a predetermined distance between the first substrate SUB1 and the second substrate SUB2. The filler layer FL can be disposed (or accommodated) inside the sealant SL.

The first substrate SUB1 can be made of glass material or plastic material. For example, the first substrate SUB1 can be made of plastic material such as polyimide (PI), polyethylene terephthalate (PET), polyethylene naphthalate (PEN), and polycarbonate (PC) and can have flexible characteristics.

The first substrate SUB1 can be divided into a thin film transistor region TA, in which the thin film transistor T and the organic light emitting diode OLE are disposed, and an auxiliary electrode region AEA in which an auxiliary electrode AE is provided.

The thin film transistor T and the organic light emitting diode OLE connected to the thin film transistor T are formed on the thin film transistor region TA of the first substrate SUB1. A light shielding layer LS and a buffer layer BUF can be formed between the first substrate SUB1 and the thin film transistor T. The light shielding layer LS is disposed to overlap a semiconductor layer, particularly, a channel of the thin film transistor T and can protect an oxide semiconductor element from external light. The buffer layer BUF can block ions or impurities diffused from the first substrate SUB1 and also block moisture penetration from the outside.

The thin film transistor T includes a semiconductor layer ACT, a gate electrode GE, a source electrode SE, and a drain electrode DE.

A gate insulating layer GI and the gate electrode GE are disposed on the semiconductor layer ACT. The gate insulating layer GI functions to insulate the gate electrode GE and can be formed of silicon oxide (SiOx). However, embodiments are not limited thereto. The gate electrode GE is disposed to overlap the semiconductor layer ACT with the gate insulating layer GI interposed therebetween. The gate electrode GE can be formed as a single layer or a multilayer using copper (Cu), molybdenum (Mo), aluminum (Al), chrome (Cr), gold (Au), titanium (Ti), nickel (Ni), neodymium (Nd), tantalum (Ta), tungsten (W), or a combination thereof. The gate insulating layer GI and the gate electrode GE can be patterned using the same mask. In this instance, the gate insulating layer GI and the gate electrode GE can have the same area. Although not shown, the gate insulating layer GI can be formed to cover the entire surface of the first substrate SUB1.

An interlayer dielectric layer IN is positioned on the gate electrode GE. The interlayer dielectric layer IN functions to insulate the gate electrode GE and the source and drain electrodes SE and DE from each other. The interlayer dielectric layer IN can be formed of silicon oxide (SiOx), silicon nitride (SiNx), or a multilayer thereof. However, embodiments are not limited thereto.

The source electrode SE and the drain electrode DE are positioned on the interlayer dielectric layer IN. The source electrode SE and the drain electrode DE are spaced from each other by a predetermined distance. The source electrode SE contacts one side of the semiconductor layer ACT through a source contact hole penetrating the interlayer dielectric layer IN. The drain electrode DE contacts the other side of the semiconductor layer ACT through a drain contact hole penetrating the interlayer dielectric layer IN.

Each of the source electrode SE and the drain electrode DE can be formed as a single layer or as a multilayer. When each of the source electrode SE and the drain electrode DE is formed as the single layer, each of the source electrode SE and the drain electrode DE can be formed of molybdenum (Mo), aluminum (Al), chrome (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE can be formed as a double layer of Mo/Al—Nd, Mo/Al, Ti/Al or Cu/MoTi, or as a triple layer of Mo/Al—Nd/Mo, Mo/Al/Mo, Ti/Al/Ti or MoTi/Cu/MoTi.

A passivation layer PAS is positioned on the thin film transistor T. The passivation layer PAS protects the thin film transistor T and can be formed of silicon oxide (SiOx), silicon nitride (SiNx), or a multilayer thereof.

A planarization layer OC is positioned on the passivation layer PAS. The planarization layer OC can reduce or planarize a height difference (or step coverage) of an underlying structure and can be formed of an organic material such as photo acryl, polyimide, benzocyclobutene-based resin, and acrylate-based resin. If necessary or desired, one of the passivation layer PAS and the planarization layer OC can be omitted.

The organic light emitting diode OLE and the auxiliary electrode AE are positioned on the planarization layer OC. The organic light emitting diode OLE can be provided in the thin film transistor region TA, and the auxiliary electrode AE can be provided in the auxiliary electrode region AEA. The organic light emitting diode OLE includes an anode ANO, an organic compound layer OL, and a cathode CAT.

More specifically, the anode ANO is positioned on the planarization layer OC. The anode ANO is connected to the drain electrode DE of the thin film transistor T through a contact hole penetrating the passivation layer PAS and the planarization layer OC. The anode ANO can include a reflective layer and thus serve as a reflective electrode. The reflective layer can be formed of aluminum (Al), copper (Cu), silver (Ag), palladium (Pd), nickel (Ni), or a combination thereof. For example, the reflective layer can be formed of Ag/Pd/Cu (APC) alloy. The anode ANO can be formed as a multilayer including a reflective layer.

The auxiliary electrode AE is positioned on the planarization layer OC. The auxiliary electrode AE can include a low resistance conductive material. As will be described later, the auxiliary electrode AE can be connected to the cathode CAT and can function to reduce a resistance of the cathode CAT. The auxiliary electrode AE can be formed of the same material as the anode ANO at the same layer as the anode ANO. In this instance, because a separate process for forming the auxiliary electrode AE does not need to be performed, the number of processes can be reduced. Hence, the manufacturing time and the manufacturing cost can be reduced, and product yield can be remarkably improved.

The auxiliary electrode AE can be electrically connected to a low potential power voltage line (hereinafter referred to as "Evss line") EVL disposed under the auxiliary electrode AE with at least one insulating layer interposed therebetween. The Evss line EVL can receive a low potential power voltage from a power generating part and transfer the low potential power voltage to the auxiliary electrode AE. The auxiliary electrode AE and the Evss line EVL can be connected to each other through a contact hole penetrating at least one insulating layer between them.

As shown in FIGS. 3 and 4, the Evss line EVL can be formed on the same layer as the source electrode SE and the drain electrode DE using the same material as them and can be connected to the auxiliary electrode AE through an auxiliary contact hole AH penetrating the planarization layer OC and the passivation layer PAS. However, embodiments are not limited thereto and include other variations. For example, the Evss line EVL can be formed on the same layer as the gate electrode GE or the light shielding layer LS using the same material as the gate electrode GE or the light shielding layer LS. As another example, the Evss line EVL can be provided as a plurality of layers disposed at different layers with at least one insulating layer interposed therebetween, and the plurality of layers can be connected to one another through a contact hole penetrating the at least one insulating layer.

The Evss line EVL includes a low resistance conductive material. For example, the Evss line EVL can be formed of molybdenum (Mo), aluminum (Al), chromium (Cr), gold (Au), titanium (Ti), nickel (Ni), neodymium (Nd), copper (Cu), or a combination thereof.

A bank layer BN is positioned on the first substrate SUB1, on which the anode ANO and the auxiliary electrode AE are formed, and partitions pixels. The bank layer BN can be formed of an organic material such as polyimide, benzocyclobutene-based resin, and acrylate.

The bank layer BN includes a first opening exposing most of the anode ANO. The bank layer BN can be configured to expose a center portion of the anode ANO and cover an edge of the anode ANO. The exposed portion of the anode ANO can be designed to have as large an area as possible, in order to sufficiently secure an aperture ratio. The center portion of the anode ANO exposed by the bank layer BN can be defined as an emission region.

Further, the bank layer BN includes a second opening exposing most of the auxiliary electrode AE. The bank layer BN can be configured to expose a center portion of the auxiliary electrode AE and cover an edge of the auxiliary electrode AE.

The bank layer BN and the planarization layer OC can be patterned to cover only the thin film transistor T and a storage capacitor Cst connected to the thin film transistor T inside the pixel. As shown in FIGS. 3 and 4, the storage capacitor Cst can have a triple structure in which first to third capacitor electrodes are stacked. However, embodiments are not limited thereto and include other variations. For example, the storage capacitor Cst can be implemented as a plurality of layers, if necessary.

A barrier BR is positioned on the first substrate SUB1 on which the bank layer BN is formed. The barrier BR is positioned on the auxiliary electrode AE. The barrier BR functions to physically divide each of the organic compound layer OL and the cathode CAT that will be formed later. In other words, each of the organic compound layer OL and the cathode CAT is disposed on the auxiliary electrode AE and is physically divided by the barrier BR. Hence, each of the organic compound layer OL and the cathode CAT can be discontinuously formed on the auxiliary electrode AE.

The organic compound layer OL is positioned on the first substrate SUB1 on which the bank layer BN and the barrier BR are formed. The organic compound layer OL can be widely formed on the entire surface of the first substrate SUB1. The organic compound layer OL is a layer, in which electrons and holes combine and emit light. The organic compound layer OL includes an emission layer EML and can further include one or more of a hole injection layer HIL, a hole transport layer HTL, an electron transport layer ETL, and an electron injection layer EIL. The emission layer EML can include a light emitting material that generates white light.

The organic compound layer OL for emitting white light can have a multi-stack structure, for example, an n-stack structure, where n is an integer equal to or greater than 1. For example, 2-stack structure can include a charge generation layer CGL between the anode ANO and the cathode CAT and a first stack and a second stack respectively disposed on and under the charge generation layer CGL. Each of the first stack and the second stack includes an emission layer and can further include at least one common layer. The emission layer of the first stack and the emission layer of the second stack can include emission materials of different colors, respectively.

The organic compound layer OL on the auxiliary electrode AE is physically divided by the barrier BR. The organic compound layer OL is divided by the barrier BR and exposes at least a portion of the auxiliary electrode AE around the barrier BR. A portion of the organic compound layer OL divided by the barrier BR is positioned on the barrier BR.

The cathode CAT is positioned on the organic compound layer OL. The cathode CAT can be widely formed on the entire surface of the first substrate SUB1. The cathode CAT can be formed of a transparent conductive material such as indium tin oxide (ITO) and indium zinc oxide (IZO). Alternatively, the cathode CAT can be formed of a material, which is thin enough to transmit light, for example, magnesium (Mg), calcium (Ca), aluminum (Al), silver (Ag), or a combination thereof.

The cathode CAT on the auxiliary electrode AE is physically divided by the barrier BR. The cathode CAT is divided by the barrier BR and exposes at least a portion of the auxiliary electrode AE around the barrier BR. A portion of the cathode CAT divided by the barrier BR is positioned on the barrier BR.

The cathode CAT covers the organic compound layer OL, and one end of the cathode CAT directly contacts the auxiliary electrode AE. Namely, one end of the cathode CAT, which is divided by the barrier BR and is exposed, directly contacts an exposed upper surface of the auxiliary electrode AE. Such a structure can be implemented by a step coverage difference between materials forming the organic compound layer OL and the cathode CAT. For example, because the cathode CAT is made of a transparent conductive material with better step coverage than a formation material of the organic compound layer OL, the cathode CAT can be configured to directly contact the auxiliary electrode AE. Furthermore, in order to implement the structure, the organic compound layer OL and the cathode CAT can be formed using different methods. For example, the organic compound layer OL can be formed using a thermal deposition method, and the cathode CAT can be formed using a sputtering method. Hence, one end of the cathode CAT can be extended more than one end of the organic compound layer OL and can directly contact the auxiliary electrode AE.

The embodiment of the disclosure can reduce a voltage variation depending on a position by electrically connecting the auxiliary electrode AE formed of a low resistance conductive material to the cathode CAT. Hence, the embodiment of the disclosure can minimize non-uniformity of the luminance.

The cathode CAT is electrically connected to the Evss line EVL through the auxiliary electrode AE and thus can receive the low potential power voltage. Namely, the embodiment of the disclosure can provide a power supply path in which the Evss line EVL, the auxiliary electrode AE, and the cathode CAT are sequentially connected. And/or, the cathode CAT can directly receive the low potential power voltage from a power generating part. Namely, the cathode CAT can directly receive the low potential power voltage supplied through a pad provided at one side of the first substrate SUB1.

The color filter CF is formed on the second substrate SUB2 attached to the first substrate SUB1. The color filter CF can include red (R), blue (B), and green (G) color filters. The pixel can include subpixels emitting red, blue, and green light, and the color filters CF can be respectively assigned to the corresponding subpixels. If necessary or desired, the pixel can further include a white (W) subpixel. The red, blue, and green color filters CF can be partitioned by a black matrix BM. The black matrix BM is provided between the neighboring color filters CF on the second substrate SUB2 and can prevent a defect of color mixture from occurring.

The completed first and second substrates SUB1 and SUB2 are attached to each other with the filler layer FL interposed therebetween. The filler layer FL can be formed of an epoxy-based resin and an acryl-based resin. However, embodiments are not limited thereto and include other variations.

A protective layer PL for protecting the components can be provided on the first substrate SUB1. The protective layer PL is positioned on the cathode CAT. The protective layer PL can be widely formed on the entire surface of the first substrate SUB1. The protective layer PL can be formed of an inorganic material such as silicon oxide (SiOx) and silicon nitride (SiNx).

More specifically, the protective layer PL is positioned on the cathode CAT and can block the penetration of foreign material that can enter the organic light emitting diode OLE. For example, because the cathode CAT including a transparent conductive material is a crystalline component and cannot block the penetration of ions and moisture, moisture entering from a filler layer can pass through the cathode CAT and can enter the organic compound layer OL. The embodiment of the disclosure further includes the protective layer PL on the organic light emitting diode OLE and can block moisture that can enter the organic light emitting diode OLE. Hence, the embodiment of the disclosure can prevent or minimize a reduction in lifespan of the organic light emitting diode OLE and a luminance reduction.

In addition, the protective layer PL is positioned on the cathode CAT and can buffer or mitigate a stress applied to the cathode CAT when the first substrate SUB1 and the second substrate SUB2 are attached to each other. For example, because the cathode CAT including the transparent conductive material has brittle characteristics, the cathode CAT can easily crack due to an external force applied. The embodiment of the disclosure further includes the protective layer PL on the cathode CAT and can prevent or minimize a crack from being generated in the cathode CAT. Furthermore, the embodiment of the disclosure can prevent or minimize the penetration of oxygen or moisture through the crack.

The protective layer PL can have a thickness more than a predetermined thickness to perform the above-described functions. Namely, the protective layer PL needs to have a thickness more than a previously set first thickness t1 to smoothly perform a moisture blocking function and a buffer function. For example, a thickness of the protective layer PL can be set to several micrometers (μm). A chemical vapor deposition (CVD) process can be used to provide the protective layer PL of the first thickness t1.

The protective layer PL needs to be widely formed so that it can cover the entire surface of the organic light emitting diode OLE, in order to perform the above-described functions. However, because the protective layer PL is formed using the CVD process with bad step coverage due to the thickness limitations, the protective layer PL is not continuously formed and is physically divided in an area where the barrier BR is provided. In other words, as shown in (a) and (b) of FIG. 4, the protective layer PL on the auxiliary electrode AE is physically divided by the barrier BR.

In this instance, moisture can enter between the divided protective layers PL, and the light emitting element can be deteriorated due to the moisture. For example, during a process for applying a formation material of the filler layer FL on the first substrate SUB1 when the first substrate SUB1 and the second substrate SUB2 are attached, moisture penetrating from the outside can enter between the divided protective layers PL. As another example, moisture penetrating along the sealant SL and the filler layer FL can enter between the divided protective layers PL.

Figure 5:
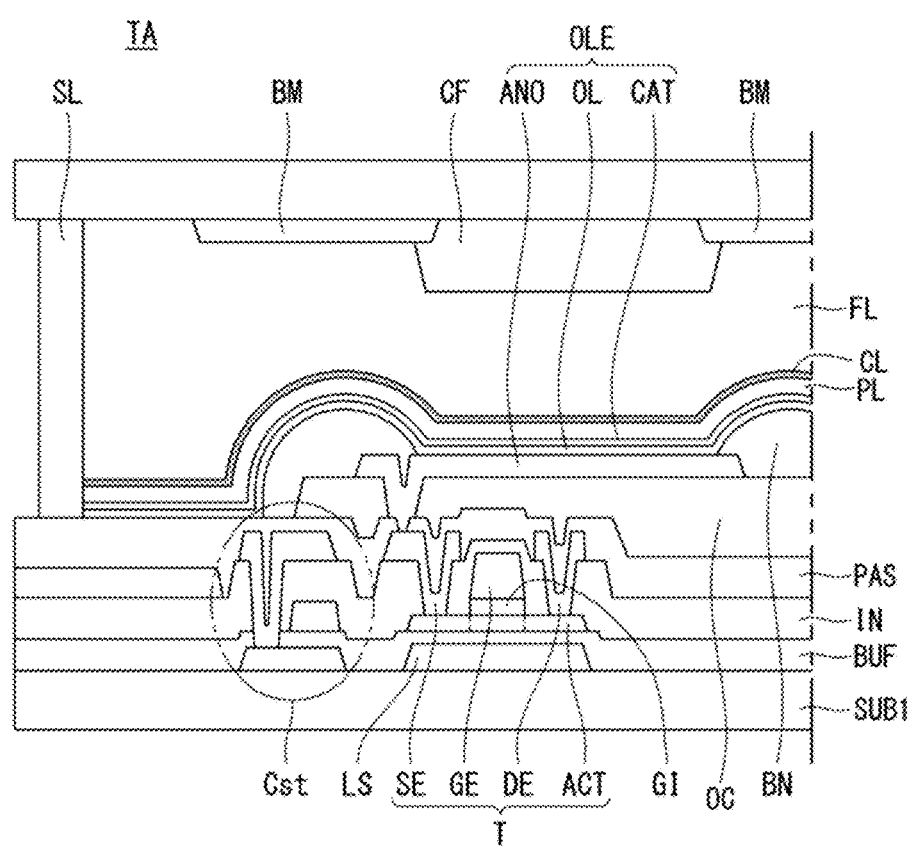
FIG. 5 is a cross-sectional view schematically illustrating a thin film transistor region according to the first embodiment of the disclosure.
Figure 6:
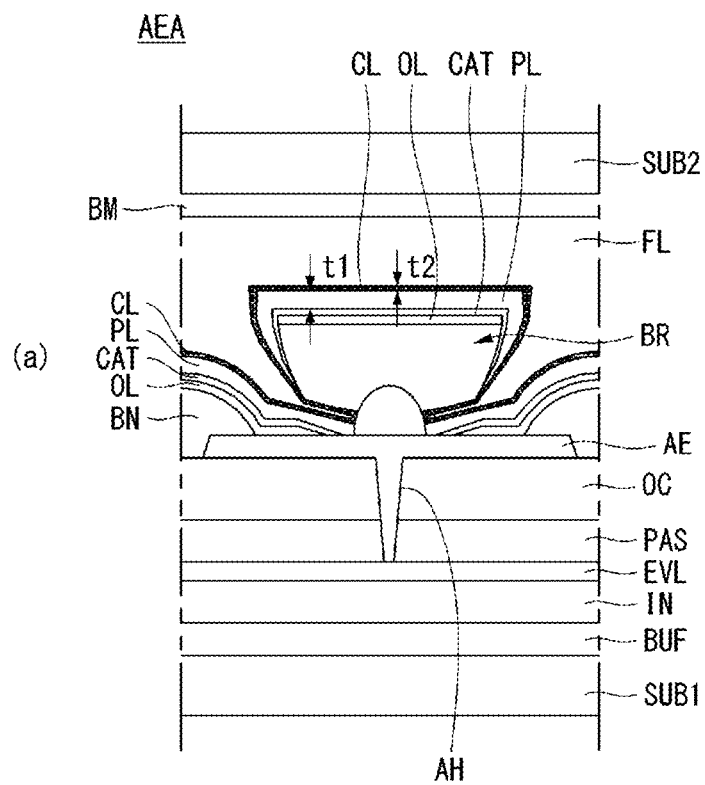
FIG. 6 is a cross-sectional view schematically illustrating an auxiliary electrode region according to the first embodiment of the disclosure.
Figure 6:
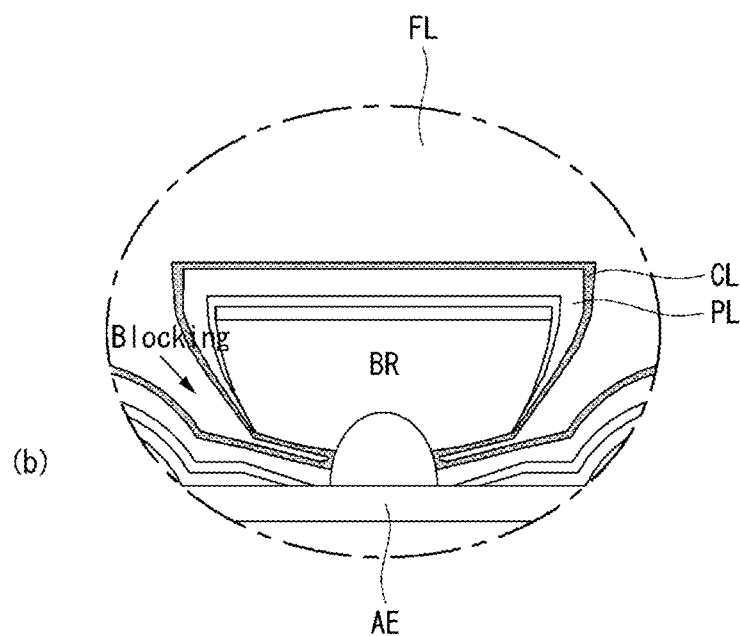
Figure 7:
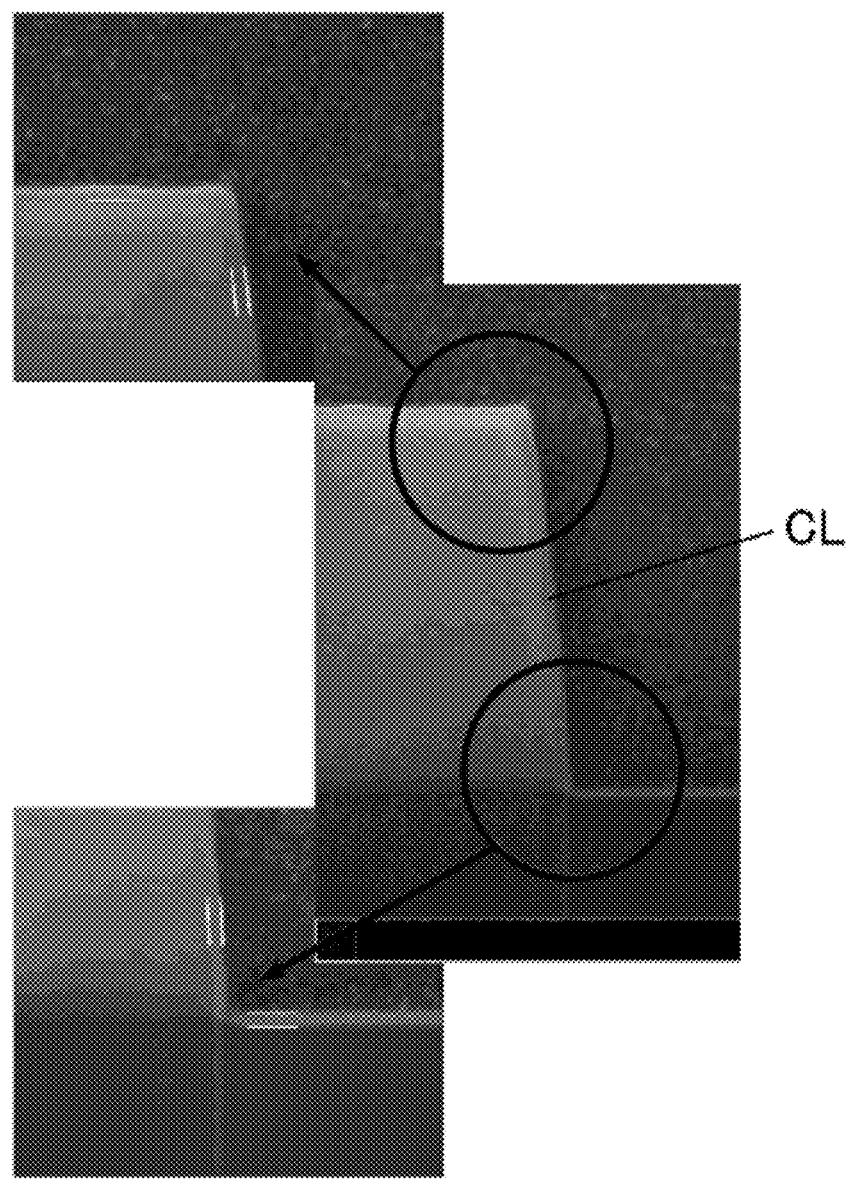
FIG. 7 illustrates step coverage characteristics of an atomic layer deposition (ALD) process.

FIG. 5 is a cross-sectional view schematically illustrating another example of a thin film transistor region according to the first embodiment of the disclosure. FIG. 6 is a cross-sectional view schematically illustrating another example of an auxiliary electrode region according to the first embodiment of the disclosure. Particularly, (b) of FIG. 6 shows an enlarged area in (a) of FIG. 6. FIG. 7 illustrates step coverage characteristics of an atomic layer deposition (ALD) process.

Referring to FIGS. 5 and 6, the OLED display according to the first embodiment of the disclosure further includes a cover layer CL on the first substrate SUB1 on which the protective layer PL is formed.

The cover layer CL is widely formed on the first substrate SUB1 to cover all of the protective layer PL, the barrier BR, the exposed auxiliary electrode AE, etc. The cover layer CL is provided to shield an open area generated as the protective layer PL is divided. The cover layer CL is formed as one body so that it is continuously formed (or has its continuity) on the entire surface of the first substrate SUB1. Namely, the cover layer CL is not divided by the barrier BR and is continuously formed (or maintains its continuity), unlike the protective layer PL. Hence, the cover layer CL is disposed to cover an external surface of the barrier BR.

The first embodiment of the disclosure can efficiently prevent the penetration of moisture into the light emitting element by including the cover layer CL, thereby minimizing the deterioration of the light emitting element. Hence, the first embodiment of the disclosure can provide an OLED display with improved product reliability.

The first embodiment of the disclosure can use an atomic layer deposition (ALD) process to provide the above-described cover layer CL. The first embodiment of the disclosure can form the cover layer CL capable of completely covering the entire surface of the first substrate SUB1 using the ALD process with good step coverage. Further, it can be seen from FIG. 7 that a layer, that is not divided at a sharp slope and is continuously formed, can be formed using the ALD process.

The cover layer CL can be formed of an inorganic material. For example, the cover layer CL can be formed of aluminum oxide ($Al_2O_3$) and silicon nitride (SiNx). Because it is sufficient that the cover layer CL blocks a fine moisture penetration path formed as the protective layer PL is divided, the cover layer CL can be formed relatively thin. Because the cover layer CL is formed thin as described above, the embodiment of the disclosure has an advantage in terms of manufacturing processes for (mass) production applications. A thickness of the cover layer CL can be set to several nanometers (nm). For example, the cover layer CL can have a second thickness t2 thinner than the protective layer PL having the first thickness t1.

Figure 8:
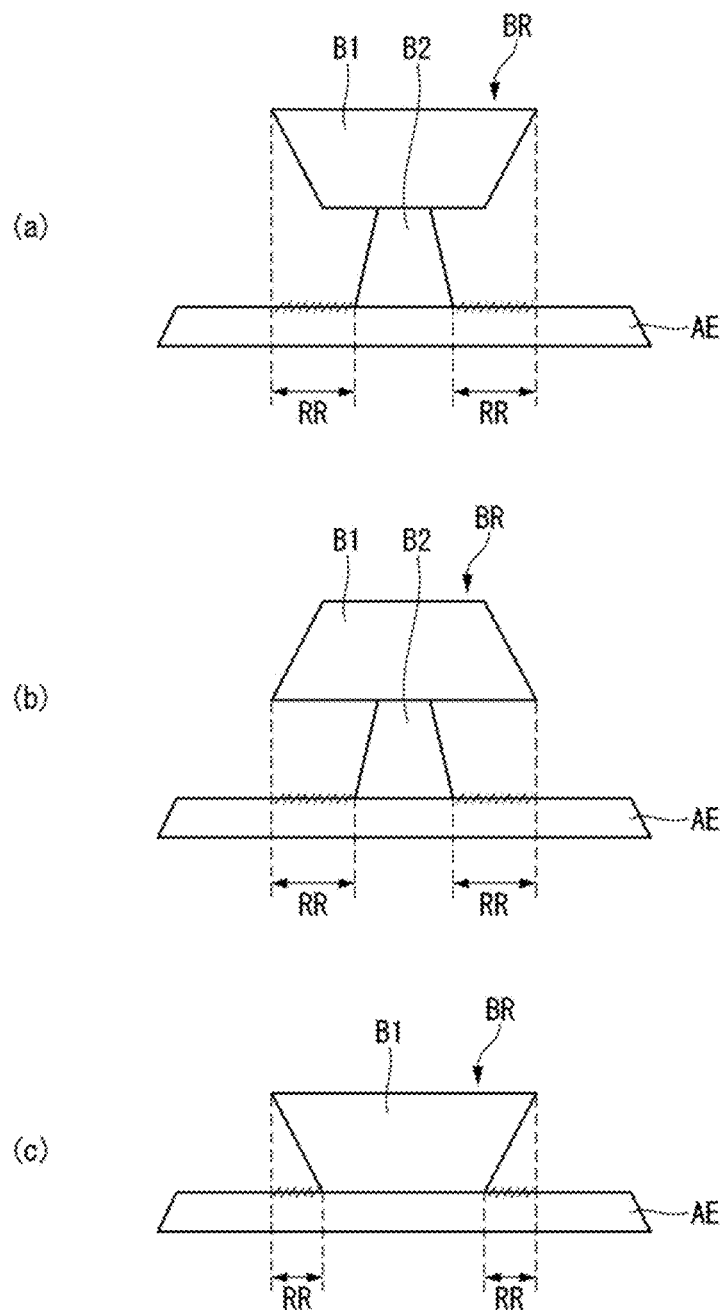
FIG. 8 is cross-sectional views schematically illustrating examples of a shape of a barrier.

FIG. 8 is cross-sectional views schematically illustrating examples of a shape of a barrier according to the disclosure.

Referring to FIG. 8, the barrier BR can be formed as a double layer including a first structure B1 and a second structural B2. The first structure B1 can be disposed on the second structural B2, and an edge of the first structure B1 can have an eaves shape. Namely, the edge of the first structure B1 can protrude from an edge of the second structural B2 to the outside by a predetermined distance RR. The distance RR between the edge of the first structure B1 and the edge of the second structural B2 can be properly selected so that the barrier BR can expose at least a portion of the auxiliary electrode AE while dividing each of the organic compound layer OL (see FIG. 6) and the cathode CAT (see FIG. 6). In other words, each of the organic compound layer OL (see FIG. 6) and the cathode CAT (see FIG. 6) is patterned to expose at least a portion of the auxiliary electrode AE while being divided around the barrier BR due to the predetermined distance RR between the edge of the first structure B1 and the edge of the second structural B2. The first structure B1 can have a reverse taper shape as shown in (a) of FIG. 8 and can have a taper shape as shown in (b) of FIG. 8. The first structure B1 and the second structural B2 can be formed of different materials.

The barrier BR can be formed as a single layer including a first structure B1. In this instance, the first structure B1 has a shape in which an edge of an upper side protrudes from an edge of a lower side to the outside by a predetermined distance RR. For example, the first structure B1 can have a reverse taper shape as shown in (c) of FIG. 8. Namely, a vertical cross-sectional shape of the first structure B1 can have a trapezoidal shape, the upper side can have a length longer than the lower side, and one end of the upper side can protrude from one end of the lower side to the outside by the predetermined distance RR. The distance RR between one end of the upper side and one end of the lower side can be properly selected so that the barrier BR can expose at least a portion of the auxiliary electrode AE while dividing each of the organic compound layer OL (see FIG. 6) and the cathode CAT (see FIG. 6). In other words, each of the organic compound layer OL (see FIG. 6) and the cathode CAT (see FIG. 6) is patterned to expose at least a portion of the auxiliary electrode AE while being divided around the barrier BR due to the distance RR between one end of the upper side and one end of the lower side.

Second Embodiment

Figure 9:
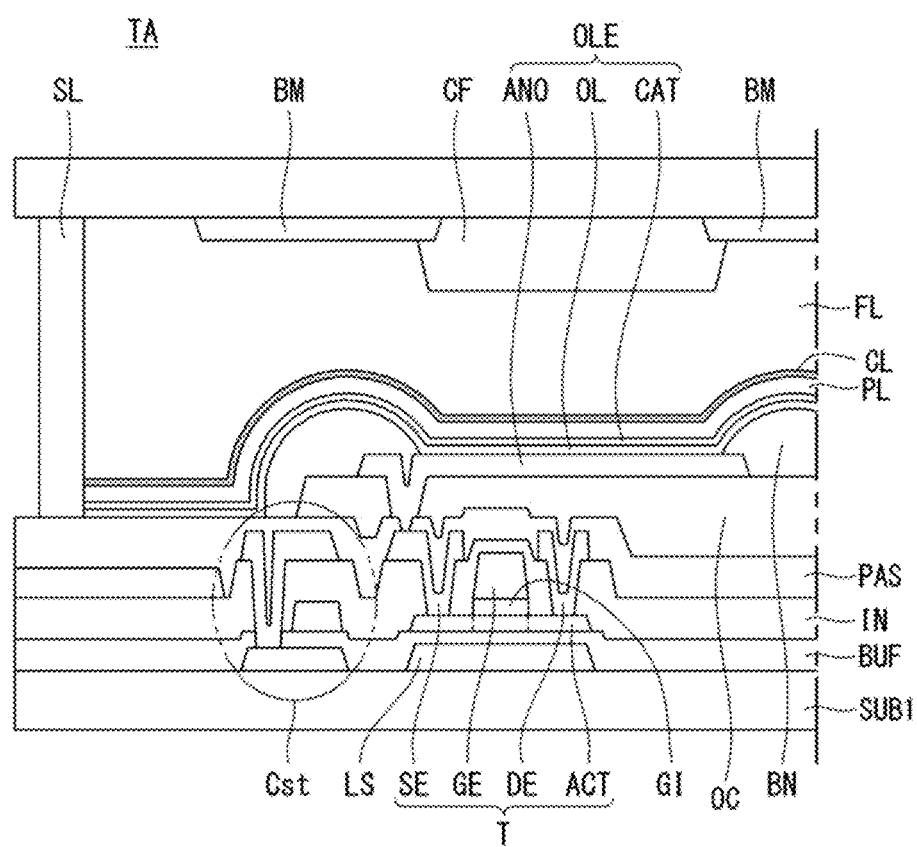
FIG. 9 is a cross-sectional view schematically illustrating a thin film transistor region according to a second embodiment of the disclosure.
Figure 10:
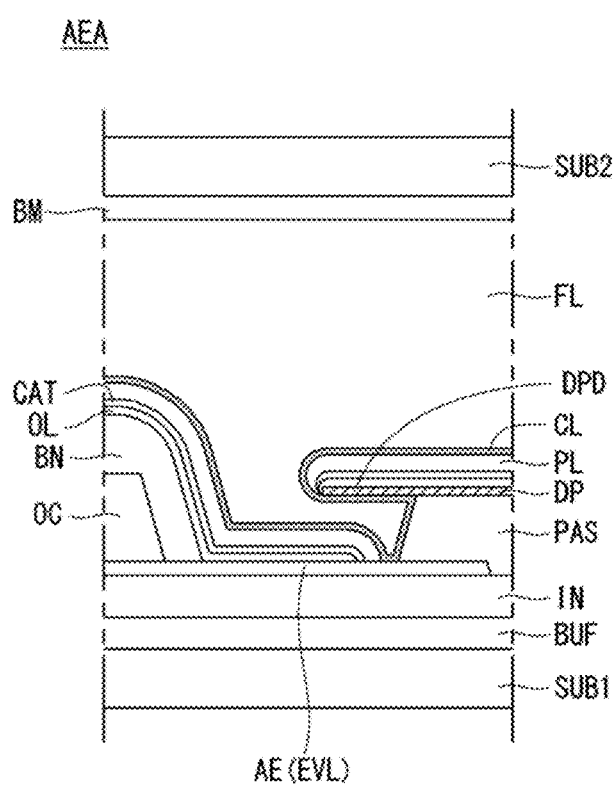
FIG. 10 is a cross-sectional view schematically illustrating an auxiliary electrode region according to the second embodiment of the disclosure.
Figure 11A:
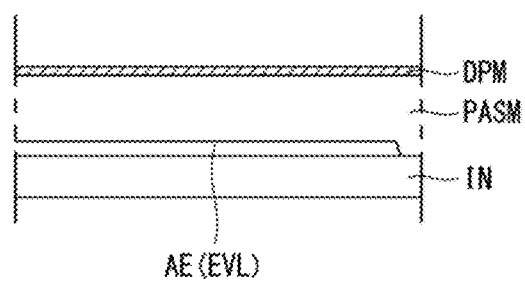
FIGS. 11A and 11B time-sequentially illustrate a method for forming a protrusion. according to an example of the disclosure
Figure 11B:
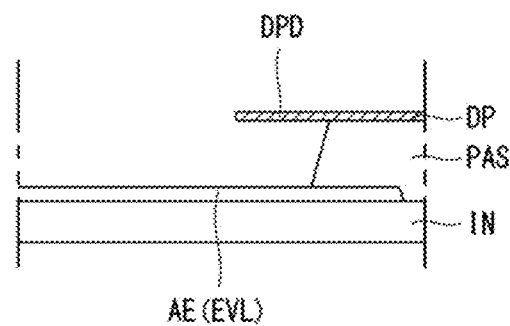

FIG. 9 is a cross-sectional view schematically illustrating a thin film transistor region according to a second embodiment of the disclosure. FIG. 10 is a cross-sectional view schematically illustrating an auxiliary electrode region according to the second embodiment of the disclosure. FIGS. 11A and 11B time-sequentially illustrate a method for forming a protrusion according to an embodiment of the disclosure. As an example, configuration of the second embodiment is different from configuration of the first embodiment in the auxiliary electrode region, and thus the second embodiment will be described below focusing on the auxiliary electrode region.

Referring to FIGS. 9 and 10, an OLED display according to the second embodiment of the disclosure includes a display panel including a first substrate SUB1 and a second substrate SUB2 facing each other. A filler layer FL can be interposed between the first substrate SUB1 and the second substrate SUB2.

The first substrate SUB1 is a thin film transistor array substrate on which a thin film transistor T and an organic light emitting diode OLE are disposed. The second substrate SUB2 is a color filter array substrate on which a color filter CF is disposed. The second substrate SUB2 can function as an encapsulation substrate. The first substrate SUB1 and the second substrate SUB2 can be attached to each other using a sealant SL. The sealant SL is disposed at an edge of the first substrate SUB1 and an edge of the second substrate SUB2 and maintains a predetermined distance between the first substrate SUB1 and the second substrate SUB2. The filler layer FL can be disposed (or accommodated) inside the sealant SL.

The first substrate SUB1 can be divided into a thin film transistor region TA, in which the thin film transistor T and the organic light emitting diode OLE are disposed, and an auxiliary electrode region AEA in which an auxiliary electrode AE is provided. The thin film transistor T and the organic light emitting diode OLE connected to the thin film transistor T are formed on the thin film transistor region TA of the first substrate SUB1. The auxiliary electrode AE connected to a cathode CAT is formed on the auxiliary electrode region AEA of the first substrate SUB1.

The auxiliary electrode AE is positioned on an interlayer dielectric layer IN. The auxiliary electrode AE can include a low resistance conductive material. As will be described later, the auxiliary electrode AE can be connected to the cathode CAT and can function to reduce a resistance of the cathode CAT. The auxiliary electrode AE can be formed of the same material as a source electrode SE and a drain electrode DE at the same layer as them. However, embodiments are not limited thereto and include other variations.

The auxiliary electrode AE can serve as an Evss line EVL. Namely, the auxiliary electrode AE can be a portion of the Evss line EVL or a portion branched from the Evss line EVL. The auxiliary electrode AE can receive a low potential power voltage from a power generating part.

The auxiliary electrode AE can be electrically connected to the Evss line EVL disposed under the auxiliary electrode AE with at least one insulating layer interposed therebetween. The Evss line EVL can receive the low potential power voltage from the power generating part and transfer the low potential power voltage to the auxiliary electrode AE. The auxiliary electrode AE and the Evss line EVL can be connected to each other through a contact hole penetrating at least one insulating layer between them.

A passivation layer PAS and a planarization layer OC are sequentially positioned on the first substrate SUB1 on which the auxiliary electrode AE is formed. The passivation layer PAS exposes at least a portion of the auxiliary electrode AE.

The planarization layer OC is positioned on the first substrate SUB1 on which the passivation layer PAS is formed. The planarization layer OC exposes at least a portion of each of the exposed auxiliary electrode AE and the passivation layer PAS.

A dummy pattern DP is positioned on the first substrate SUB1 on which the planarization layer OC is formed. The dummy pattern DP can be formed of the same material as the anode ANO at the same layer as the anode ANO. However, embodiments are not limited thereto. The dummy pattern DP is disposed on the passivation layer PAS exposed as the planarization layer OC is removed in an area overlapping with the auxiliary electrode AE. The dummy pattern DP is provided so that an end protrudes more than the passivation layer PAS in the area overlapping with the auxiliary electrode AE. The end of the dummy pattern DP protruding more than the passivation layer PAS can be referred to as a protrusion DPD.

The protrusion DPD functions to physically divide each of an organic compound layer OL and the cathode CAT that will be formed later. In other words, each of the organic compound layer OL and the cathode CAT is disposed on the auxiliary electrode AE and is physically divided by the protrusion DPD. Hence, each of the organic compound layer OL and the cathode CAT can be discontinuously formed on the auxiliary electrode AE.

The protrusion DPD can be implemented by a difference in etch selectivity between a material constituting the passivation layer PAS and a material constituting the dummy pattern DP. Namely, referring to FIGS. 11A and 11B, a material PASM constituting the passivation layer PAS and a material DPM constituting the dummy pattern DP are applied on the auxiliary electrode AE, and an etching process for patterning the materials PASM and DPM is performed. Because the material PASM constituting the passivation layer PAS is selected as a material having a large etch selectivity difference with respect to the material DPM constituting the dummy pattern DP, an etching amount of the material PASM constituting the passivation layer PAS can be relatively more than an etching amount of the material DPM constituting the dummy pattern DR Hence, the passivation layer PAS can have an undercut shape depressed to the inside of the dummy pattern DR A portion of the dummy pattern DP can protrude more than the passivation layer PAS due to the undercut shape and thus can be implemented as the protrusion DPD.

A bank layer BN is positioned on the first substrate SUB1 on which the dummy pattern DP is formed. The bank layer BN includes a first opening exposing most of the anode ANO. Further, the bank layer BN includes a second opening exposing most of the auxiliary electrode AE and the dummy pattern DP. The second opening simultaneously exposes the auxiliary electrode AE and a center portion of the dummy pattern DP.

The organic compound layer OL is positioned on the first substrate SUB1 on which the bank layer BN is formed. The organic compound layer OL on the auxiliary electrode AE is physically divided by the protrusion DPD. The organic compound layer OL is divided by the protrusion DPD and exposes at least a portion of the auxiliary electrode AE around the protrusion DPD. The organic compound layer OL divided by the protrusion DPD is positioned on each of an upper part of the dummy pattern DP and an upper part of the auxiliary electrode AE.

The cathode CAT is positioned on the organic compound layer OL. The cathode CAT on the auxiliary electrode AE is physically divided by the protrusion DPD. The cathode CAT is divided by the protrusion DPD and exposes at least a portion of the auxiliary electrode AE around the protrusion DPD. The cathode CAT divided by the protrusion DPD is positioned on each of the upper part of the dummy pattern DP and the upper part of the auxiliary electrode AE.

The cathode CAT covers the organic compound layer OL, and one end of the cathode CAT directly contacts the auxiliary electrode AE. Namely, one end of the cathode CAT, which is divided by the protrusion DPD and is exposed, directly contacts an upper surface of the exposed auxiliary electrode AE. In other words, one end of the cathode CAT can be extended more than one end of the organic compound layer OL and can directly contact the auxiliary electrode AE.

The embodiment of the disclosure can reduce a voltage variation depending on a position by electrically connecting the auxiliary electrode AE formed of a low resistance conductive material to the cathode CAT. Hence, the embodiment of the disclosure can minimize non-uniformity of the luminance.

The cathode CAT can be connected to the auxiliary electrode AE which is a portion of the Evss line EVL, and can receive the low potential power voltage. Namely, the embodiment of the disclosure can provide a power supply path in which the auxiliary electrode AE and the cathode CAT are sequentially connected.

Alternatively, the cathode CAT can be electrically connected to the Evss line EVL disposed under the auxiliary electrode AE through the auxiliary electrode AE and can receive the low potential power voltage. Namely, the embodiment of the disclosure can provide a power supply path in which the Evss line EVL, the auxiliary electrode AE, and the cathode CAT are sequentially connected.

In addition to or as an alternative, the cathode CAT can directly receive the low potential power voltage from the power generating part. Namely, the cathode CAT can directly receive the low potential power voltage supplied through a pad provided at one side of the first substrate SUB1.

A protective layer PL is positioned on the cathode CAT. The protective layer PL needs to be widely formed on the entire surface, in order to protect a light emitting element. However, the protective layer PL is physically divided by the protrusion DPD and is discontinuously formed in an area where the protrusion DPD is provided. Namely, as shown in FIG. 10, the protective layer PL on the auxiliary electrode AE is physically divided by the protrusion DPD. In this instance, moisture can enter between the divided protective layers PL, and the light emitting element can be deteriorated due to the moisture.

To prevent or minimize the moisture penetration, the OLED display according to the second embodiment of the disclosure further includes a cover layer CL on the protective layer PL. The cover layer CL is widely formed on the first substrate SUB1 to cover all of the protective layer PL, the exposed auxiliary electrode AE, etc. The cover layer CL is provided to shield an open area generated as the protective layer PL is divided. The cover layer CL is formed as one body so that it is continuously formed (or has its continuity) on the entire surface of the first substrate SUB1. Namely, the cover layer CL is not divided by the protrusion DPD and is continuously formed (or maintains its continuity), unlike the protective layer PL. Hence, the cover layer CL is disposed to cover an external surface of the protrusion DPD.

The second embodiment of the disclosure can efficiently prevent or minimize the penetration of moisture into the light emitting element by including the cover layer CL, thereby minimizing the deterioration of the light emitting element. Hence, the second embodiment of the disclosure can provide an OLED display with improved product reliability.

Although the embodiments have been described with reference to a number of illustrative embodiments thereof, numerous other modifications and embodiments can be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
   a substrate including a thin film transistor region in which a thin film transistor and an organic light emitting diode connected to the thin film transistor are disposed, and an auxiliary electrode region in which an auxiliary electrode is disposed;
   a passivation layer disposed on the auxiliary electrode and exposing at least a portion of the auxiliary electrode;
   a dummy pattern disposed on the passivation layer, the dummy pattern including a protrusion protruding more than the passivation layer in an area overlapping with the auxiliary electrode;
   a cathode included in the organic light emitting diode, divided by the protrusion, and exposing at least a portion of the auxiliary electrode, an end of the cathode being in direct contact with the auxiliary electrode;
   a cover layer disposed on the cathode, and having continuity to cover the protrusion and the auxiliary electrode; and
   a protective layer interposed between the cathode and the cover layer,
   wherein the cover layer contacts a side of the passivation layer in a location under the protrusion of the dummy pattern, and
   wherein the cover layer is an electrical insulator.

2. The organic light emitting diode display of claim 1, wherein the protective layer is divided by the protrusion and exposes at least a portion of the auxiliary electrode.

3. The organic light emitting diode display of claim 2, wherein a thickness of the cover layer is less than a thickness of the protective layer.

4. The organic light emitting diode display of claim 2, wherein the cover layer covers an open area generated as the protective layer is divided by the protrusion.

5. The organic light emitting diode display of claim 1, further comprising a power line disposed under the auxiliary electrode with at least one insulating layer interposed therebetween, and configured to receive a power voltage from a power generating part,
   wherein the auxiliary electrode is electrically connected to the power line through a contact hole penetrating the at least one insulating layer.

6. The organic light emitting diode display of claim 1, wherein the auxiliary electrode receives a power voltage from a power generating part.

7. The organic light emitting diode display of claim 1, wherein an organic compound layer of the organic light emitting diode is divided by the protrusion and exposes at least a portion of the auxiliary electrode, and
   wherein the end of the cathode on the organic compound layer is extended more than an end of the organic compound layer and directly contacts the auxiliary electrode.

8. The organic light emitting diode display of claim 1, wherein the cover layer includes any one selected among aluminum oxide ($Al_2O_3$) and silicon nitride (SiNx).

9. The organic light emitting diode display of claim 1, wherein a lower surface of the protective layer contacts an upper surface of the cathode, and an upper surface of the protective layer contacts a lower surface of the cover layer.

10. An organic light emitting diode display comprising:
    a substrate including a thin film transistor region in which a thin film transistor and an organic light emitting diode connected to the thin film transistor are disposed, and an auxiliary electrode region in which an auxiliary electrode is disposed;
    a passivation layer disposed on the auxiliary electrode and exposing at least a portion of the auxiliary electrode;
    a dummy pattern disposed on the passivation layer, the dummy pattern including a protrusion protruding more than the passivation layer in an area overlapping with the auxiliary electrode;
    a cathode included in the organic light emitting diode, divided by the protrusion, and exposing at least a portion of the auxiliary electrode, an end of the cathode being in direct contact with the auxiliary electrode;
    a cover layer disposed on the cathode, and having continuity to cover the protrusion and the auxiliary electrode; and
    a protective layer interposed between the cathode and the cover layer,
    wherein the cover layer contacts a side of the passivation layer in a location under the protrusion of the dummy pattern, and
    wherein a lower surface of the protective layer contacts an upper surface of the cathode, and an upper surface of the protective layer contacts a lower surface of the cover layer.

11. The organic light emitting diode display of claim 10, wherein the protective layer is divided by the protrusion and exposes at least a portion of the auxiliary electrode.

12. The organic light emitting diode display of claim 11, wherein a thickness of the cover layer is less than a thickness of the protective layer.

13. The organic light emitting diode display of claim 11, wherein the cover layer covers an open area generated as the protective layer is divided by the protrusion.

14. The organic light emitting diode display of claim 10, further comprising a power line disposed under the auxiliary electrode with at least one insulating layer interposed therebetween, and configured to receive a power voltage from a power generating part,
 wherein the auxiliary electrode is electrically connected to the power line through a contact hole penetrating the at least one insulating layer.

15. The organic light emitting diode display of claim 10, wherein the auxiliary electrode receives a power voltage from a power generating part.

16. The organic light emitting diode display of claim 10, wherein an organic compound layer of the organic light emitting diode is divided by the protrusion and exposes at least a portion of the auxiliary electrode, and
 wherein the end of the cathode on the organic compound layer is extended more than an end of the organic compound layer and directly contacts the auxiliary electrode.

17. The organic light emitting diode display of claim 10, wherein the cover layer includes any one selected among aluminum oxide (Al2O3) and silicon nitride (SiNx).

\* \* \* \* \*